United States Patent
Gong et al.

(10) Patent No.: US 8,942,954 B2
(45) Date of Patent: Jan. 27, 2015

(54) FAULT LOCATION IN A NON-HOMOGENEOUS ELECTRIC POWER LINE

(75) Inventors: Yanfeng Gong, Pullman, WA (US); Armando Guzman-Casillas, Pullman, WA (US); Mangapathirao Venkata Mynam, Pullman, WA (US); Richard M. Edge, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 650 days.

(21) Appl. No.: 12/883,944

(22) Filed: Sep. 16, 2010

(65) Prior Publication Data

US 2012/0068717 A1  Mar. 22, 2012

(51) Int. Cl.
  *G21C 17/00* (2006.01)
  *G01R 31/08* (2006.01)
  *H02H 7/26* (2006.01)

(52) U.S. Cl.
  CPC .......... *G01R 31/085* (2013.01); *H02H 7/261* (2013.01); *G01R 31/088* (2013.01)
  USPC .............................. 702/185; 324/600; 324/76

(58) Field of Classification Search
  None
  See application file for complete search history.

(56) References Cited

U.S. PATENT DOCUMENTS

| | | | |
|---|---|---|---|
| 3,958,153 A * | 5/1976 | Narayan | 361/86 |
| 4,313,169 A | 1/1982 | Takagi | |
| 4,379,294 A | 4/1983 | Sutherland | |
| 4,731,689 A * | 3/1988 | Nimmersjo et al. | 361/66 |
| 4,797,805 A * | 1/1989 | Nimmersjo | 702/59 |
| 4,800,509 A * | 1/1989 | Nimmersjo | 702/58 |
| 4,996,624 A | 2/1991 | Schweitzer, III | |
| 5,123,715 A * | 6/1992 | Okubo | 303/150 |
| 5,140,492 A | 8/1992 | Schweitzer, III | |
| 5,325,061 A | 6/1994 | Schweitzer, III | |
| 5,355,717 A * | 10/1994 | Tanaka et al. | 73/105 |
| 5,367,426 A | 11/1994 | Schweitzer, III | |
| 5,428,549 A * | 6/1995 | Chen | 702/59 |
| 5,455,776 A * | 10/1995 | Novosel | 702/59 |

(Continued)

FOREIGN PATENT DOCUMENTS

| | | |
|---|---|---|
| WO | 2007032697 | 3/2007 |
| WO | 2007110004 | 4/2007 |

(Continued)

OTHER PUBLICATIONS

X Luo, M. Kezunovic Automated Analysis of Digital Relay Based on Expert System Jun. 2005.

(Continued)

*Primary Examiner* — Sujoy Kundu
*Assistant Examiner* — Alvaro Fortich
(74) *Attorney, Agent, or Firm* — Jared L. Cherry; Richard M. Edge

(57) ABSTRACT

Fault location on a non-homogeneous electric power line that includes a plurality of sections by determining a section in which negative-sequence voltage magnitude profiles calculated from each terminal of the power line intersect. The fault location may determine the faulted section and determine the location of the fault within the faulted section. To determine the fault location, the negative-sequence voltage magnitude profiles may be calculated from measurements taken at each terminal of the power line and compared to determine a point where the profiles intersect. The profiles may be calculated using power line properties and measurements from each terminal.

39 Claims, 8 Drawing Sheets

(56) References Cited

U.S. PATENT DOCUMENTS

| | | | |
|---|---|---|---|
| 5,687,308 A * | 11/1997 | Jardine et al. | 714/4.3 |
| 5,734,575 A * | 3/1998 | Snow et al. | 700/286 |
| 6,195,754 B1 * | 2/2001 | Jardine et al. | 713/324 |
| 6,256,592 B1 * | 7/2001 | Roberts et al. | 702/59 |
| 6,483,435 B2 | 11/2002 | Saha | |
| 6,876,203 B2 * | 4/2005 | Blades | 324/536 |
| 6,879,917 B2 * | 4/2005 | Turner | 702/59 |
| 7,221,166 B2 | 5/2007 | Saha | |
| 7,233,153 B2 | 6/2007 | Altonen | |
| 7,283,915 B2 | 10/2007 | Saha | |
| 7,345,862 B2 | 3/2008 | Schweitzer, III | |
| 7,514,933 B2 | 4/2009 | Altonen | |
| 7,728,600 B2 | 6/2010 | Wahlroos | |
| 8,000,913 B2 * | 8/2011 | Kreiss et al. | 702/60 |
| 8,081,002 B2 | 12/2011 | Wahlroos | |
| 8,183,871 B2 | 5/2012 | Saha | |
| 8,207,743 B2 * | 6/2012 | Balcerek et al. | 324/522 |
| 8,290,727 B2 * | 10/2012 | Kreiss et al. | 702/60 |
| 2004/0100742 A1 * | 5/2004 | Brown et al. | 361/42 |
| 2004/0138831 A1 * | 7/2004 | Watanabe et al. | 702/33 |
| 2004/0189317 A1 * | 9/2004 | Borchert et al. | 324/512 |
| 2006/0097728 A1 * | 5/2006 | Saha et al. | 324/521 |
| 2006/0142964 A1 * | 6/2006 | Saha et al. | 702/66 |
| 2008/0150356 A1 * | 6/2008 | Breit et al. | 307/9.1 |
| 2008/0150544 A1 * | 6/2008 | Premerlani et al. | 324/521 |
| 2008/0174316 A1 | 7/2008 | Wahlroos | |
| 2008/0262692 A1 * | 10/2008 | Kogure et al. | 701/90 |
| 2008/0284447 A1 | 11/2008 | Wahlroos | |
| 2008/0297163 A1 | 12/2008 | Wahlroos | |
| 2009/0105921 A1 * | 4/2009 | Hanatsuka et al. | 701/80 |
| 2009/0150099 A1 * | 6/2009 | Balcerek et al. | 702/59 |
| 2009/0187284 A1 * | 7/2009 | Kreiss et al. | 700/291 |
| 2010/0013632 A1 | 1/2010 | Salewske | |
| 2010/0053829 A1 | 3/2010 | Selejan | |
| 2010/0152910 A1 | 6/2010 | Taft | |
| 2010/0179779 A1 | 7/2010 | Taft | |
| 2010/0179780 A1 | 7/2010 | Taft | |
| 2010/0211255 A1 * | 8/2010 | Takenaka et al. | 701/29 |
| 2010/0211256 A1 * | 8/2010 | Takenaka et al. | 701/29 |
| 2010/0271743 A1 * | 10/2010 | O'Leary et al. | 361/63 |
| 2010/0277181 A1 * | 11/2010 | Saha et al. | 324/521 |
| 2011/0106458 A1 * | 5/2011 | Shiozawa et al. | 702/41 |
| 2011/0118935 A1 * | 5/2011 | Shiozawa et al. | 701/35 |
| 2011/0130974 A1 * | 6/2011 | Yngve et al. | 702/41 |
| 2011/0264388 A1 * | 10/2011 | Gong et al. | 702/58 |
| 2011/0264389 A1 * | 10/2011 | Mynam et al. | 702/58 |
| 2011/0270550 A1 * | 11/2011 | Kreiss et al. | 702/60 |
| 2012/0095707 A1 * | 4/2012 | Li et al. | 702/58 |

FOREIGN PATENT DOCUMENTS

| | | |
|---|---|---|
| WO | 2009010169 | 1/2009 |
| WO | 2009136975 | 11/2009 |
| WO | 2010006652 | 1/2010 |

OTHER PUBLICATIONS

D.R. Sevcik, R.B. Lunsford, M. Kezunovic, Z. Galijasevic, S. Banu, T. Popovic Automated Analysis of Fault Records and Dissemination of Event Reports May 2000.

M. Kezunovic, X. Luo Automated Analysis of Protective Relay Data Jun. 6, 2005.

Mladen Kezunovic, Goran Latisko, Maja Knezev, Tomo Popovic Automation of Fault Analysis: Implementation Approaches and Related Benefits Jul. 2007.

X Luo, M. Kezunovic Fault Analysis Based on Integration of Digital Relay and DFR Data Jun. 2005.

M. Kezunovic, M. Knezev Fault Location Using Sparse IED Recordings Nov. 2007.

Mladen Kezunovic PSerc Seminar: Integration of Operational and Non-Operational Data for Improved EMS Monitoring Nov. 18, 2008.

Mladen Kezunovic, Ergun Akleman, Maja Knezev, Ozgur Gonnen, Satish Natti Optimized Fault Location Aug. 19, 2007.

BPL Global Power SG® Rapid Fault Locator 2009.

Ratan Das Determining the Location of Faults in Distribution Systems 1998.

Hashim Hizam, P.A. Crossley Estimation of Fault Location on Radial Distribution Network Using Fault Generated Traveling Wave Signals 2007.

J. Mora, J Melendez, Marc Vinyoles, J Sanchez, Manel Castro An Overview to Fault Location Methods in Distribution System Based on Single End Measurements of Voltage and Current Mar. 31, 2004.

T.H.M. El-Fouly, C. Abbey On the Compatability of Fault Location Approaches and Distributed Generation Jul. 29, 2009.

Dan Ehrenreich Fault Location Integrated with DA Enhances MV Distribution Grid Control Jun. 13, 2006.

Fengling Han, Xinghuo Yu, Majid Al-Dabbagh, Yi Wang Fault Location in Power Distribution Networks Using Sinusoidal Steady State Analysis 2005.

Rodrigo A.F. Pereira, Mladen Kezunovic, Jose R.S. Mantovani Fault Location Algorithm for Primary Distribution Feeders Based on Voltage Sags Apr. 2009.

Ryszard Orlowski, Akhtar Kalam Fault Detection and Location on Distribution Feeders Sep. 29, 1999.

Bo-Gun Jin, Duck-Su Lee, Seung-Jae Lee, Myeon-Song Choi, Sang-Hee Kang, Bok-Shin Ahn, Nam-Sun Yoon, Ho-Yong Kim, Heung-Jae Lee Intelligent Fault Location and Diagnosis System on Radial Distribution Systems Jun. 24, 2002.

Laurentiu Nastac, Anupam Thatte Distribution System Fault Analysis, U.S. Department of Energy, Office of Electricity Delivery and Energy Reliability, FY06 Annual Program and Peer Review Meeting May 25, 2006.

Venkat Mynam Fault Location Theory for Transmission Lines 2007.
Schweitzer Engineering Laboratories, Inc. SEL-Profile Transmission Line Fault Analysis Program May 30, 2008.

Demitrios Tziouvaras, Jeff Roberts, Gabriel Benmouyal New Multi-Ended Fault Location Design for Two- or Three-Terminal Lines Nov. 1, 2004.

Karl Zimmerman, David Costello Impedance-Based Fault Location Experience Oct. 2004.

David Costello, Karl Zimmerman Distance Element Improvements—A Case Study Apr. 1, 2008.

Edmund O. Schweitzer, III, Jeff Roberts Distance Relay Element Design Apr. 1993.

J. Roberts, A. Guzman, E.O. Schweitzer, III Z=V/I Does Not Make a Distance Relay Oct. 1993.

D. Daniel Sabin, Cristiana Dimitriu, David Santiago, George Baroudi Overview of an Automatic Distribution Fault Location System May 4, 2010.

Edmund O. Schweitzer, III, David Whitehead, Armando Guzman, Yanfeng Gong, Marcos Donolo Advanced Real-Time Synchrophasor Applications Sep. 23, 2008.

Franco De Villiers, Marcos Donolo, Armando Guzman, Mani Venkatasubramanian Mitigating Voltage Collapse Problems in the Natal Region of South Africa Sep. 16, 2009.

Z.M. Radojevic, C.H. Kim, M. Popov, G. Preston, V. Terzija New Approach for Fault Location on Transmission Lines Not Requiring Line Parameters Jun. 3, 2009.

S. Lopez, J. Gomez, R. Cimadevilla, Synchrophasor Applications of the National Electric System Operator of Spain, 61st Annual Conference for Protective Relay Engineers Apr. 1, 2008.

David J. Lawrence, Luis Z. Cabeza, Lawrence T. Hochberg, Development of an Advanced Transmission Line Fault Location System Part II—Algorithm Development and Simulation, IEEE Transactions on Power Delivery, vol. 7., No. 4, Oct. 1992.

Edmund O. Schweitzer, III, Evaluation and Development of Transmission Line Fault Locating Techniques Which Use Sinusoidal Steady-State Information, 9th Annual Western Protective Relay Conference, Oct. 26-28, 1982.

T. Takagi, Y. Yamakoshi, M. Yamaura, R. Kondou, T. Matsushima, Development of a New Fault Type Locator Using the One-Terminal Voltage and Current Data, IEEE Transaction on Power Apparatus and Systems, vol. PAS-101, No. 8, Aug. 1982, pp. 2892-2898.

D. Novosel, D.G. Hart, E. Udren, J. Garitty, Unsynchronized Two-Terminal Fault Location Estimation, IEEE Transaction on Power Delivery, vol. 11, No. 1, 1996, pp. 130-138.

A. Guzman, V. Mynam, G. Zweigle, Backup Transmission Line Protection for Ground Faults and Power Swing Detection Using

(56) References Cited

OTHER PUBLICATIONS

Synchrophasors, 34th Annual Western Protective Relay Conference, Oct. 2007.

J. Vargas, A. Guzman, J. Robles, Underground/Submarine Cable Protection Using a Negative-Sequence Directional Comparison Scheme, 1999.

Claude Fecteau, Accurate Fault Location Algorithm for Series Compensated Lines Using Two-Terminal Unsynchronized Measurements and Hydro-Quebec's Field Experience, Research Institute of Hydro-Quebec, 33rd Annual Western Protective Relay Conference, Oct. 17-19, 2006.

Siemens, Oscop P Fault Locator, Manual, Mar. 2007.

* cited by examiner

FAULT LOCATION IN A NON-HOMOGENEOUS ELECTRIC POWER LINE

RELATED APPLICATION (none)

TECHNICAL FIELD

This disclosure relates to protection of electric power delivery systems. More particularly, this disclosure relates to determining fault location in a non-homogeneous electric power line.

BRIEF DESCRIPTION OF THE DRAWINGS

Non-limiting and non-exhaustive embodiments of the disclosure are described, including various embodiments of the disclosure with reference to the figures.

DETAILED DESCRIPTION

Figure 1:
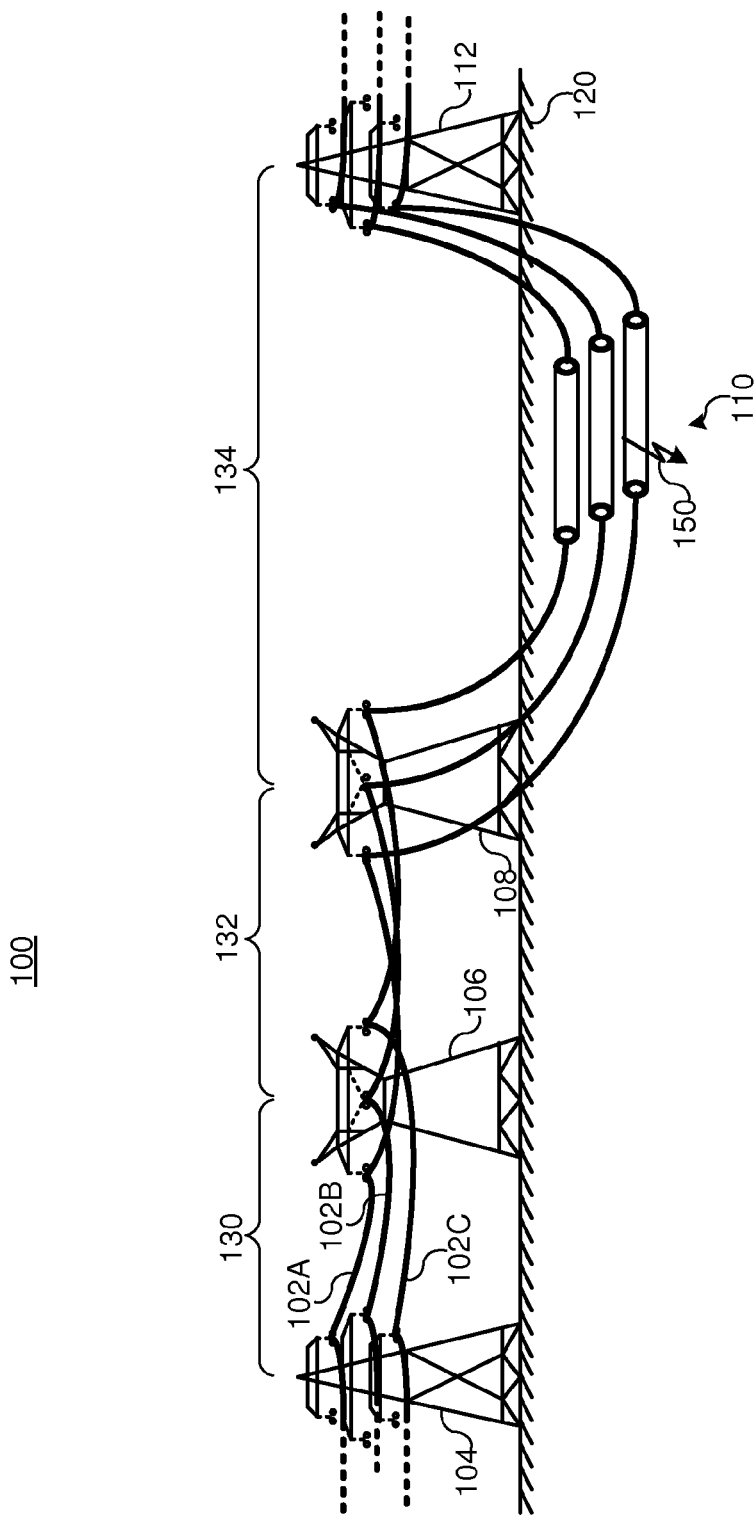
FIG. 1 illustrates a power line with a fault thereon.

Electric power lines are widely used to transmit electric power over distances between electric power generation and electric power consumers, and include, for example, transmission and distribution lines and equipment. Power lines may cover great distances and may include different types of equipment, thus making the overall power line non-homogeneous. For example, the power line may include different conductor types, different tower configurations, different distances from the conductors to ground, and certain sections of the power line may be underground where other sections may be overhead. Thus, power lines are often non-homogeneous and made up of sections with different properties. As used herein, the term "non-homogeneous" refers to any electric power line comprising two or more sections having different properties.

Reference throughout this specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout this specification are not necessarily all referring to the same embodiment. Furthermore, an "embodiment" may be a system, a method, or a product of a process.

The phrases "connected to," "networked," and "in communication with" refer to any form of interaction between two or more entities, including mechanical, electrical, magnetic, and electromagnetic interactions. Two components may be connected to each other even though they are not in direct physical contact with each other and even though there may be intermediary devices between the two components.

Some of the infrastructure that can be used with embodiments disclosed herein is already available, such as: general-purpose computers, computer programming tools and techniques, digital storage media, and communications networks. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer readable storage device such as non-volatile memory, static RAM, dynamic RAM, ROM, CD-ROM, disk, tape, magnetic, optical, flash memory, or other computer-readable storage medium.

As used herein, the term IED may refer to any microprocessor-based device that monitors, controls, automates, and/or protects monitored equipment within the power system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. IEDs may be connected to a network, and communication on the network may be facilitated by networking devices including but not limited to multiplexers, routers, hubs, gateways, firewalls, and switches, each of which may also be considered an IED. The networking devices may use a variety of physical media such as electrical, optical fiber or radio-wave connections. Furthermore, networking and communication devices may be incorporated in an IED or be in communication with an IED. The term IED may be used interchangeably to describe an individual IED or a system comprising multiple IEDs.

Aspects of certain embodiments described herein may be implemented as software modules or components. As used herein, a software module or component may include any type of computer instruction or computer executable code located within a computer-readable storage medium. A software module may, for instance, comprise one or more physical or logical blocks of computer instructions, which may be organized as a routine, program, object, component, data structure, etc., that performs one or more tasks or implements particular abstract data types.

In certain embodiments, a particular software module may comprise disparate instructions stored in different locations of a computer-readable storage medium, which together implement the described functionality of the module. Indeed, a module may comprise a single instruction or many instructions, and may be distributed over several different code sections, among different programs, and across several computer-readable storage media. Some embodiments may be practiced in a distributed computing environment where tasks are performed by a remote processing device linked through a communications network. In a distributed computing environment, software modules may be located in local and/or remote computer readable storage media. In addition, data being tied or rendered together in a database record may be resident in the same computer readable storage medium, or across several computer readable storage media, and may be linked together in fields of a record in a database across a network.

The software modules described herein tangibly embody a program, functions, and/or instructions that are executable by computer(s) to perform tasks as described herein. Suitable software, as applicable, may be readily provided by those of skill in the pertinent art(s) using the teachings presented herein and programming languages and tools, such as XML, Java, Pascal, C++, C, database languages, APIs, SDKs, assembly, firmware, microcode, and/or other languages and tools. Additionally, software, firmware, and hardware may be interchangeably used to implement a given function.

In the following description, numerous details are provided to give a thorough understanding of various embodiments. One skilled in the relevant art will recognize, however, that the embodiments disclosed herein can be practiced without one or more of the specific details, or with other methods, components, materials, etc. In other instances, well-known structures, materials, or operations are not shown or described in detail to avoid obscuring aspects of this disclosure.

FIG. 1 illustrates an example of a non-homogeneous electric power line 100. The line 100 includes conductors and other equipment for transmitting electric power on multiple phases, such as three phases A, B, and C, carried over conductors 102A, 102B, and 102C, respectively. The power line 100 includes multiple sections, including sections 130, 132, and 134, each of which may have unique properties, such as impedance characteristics. Section 130 is an overhead section where the conductors are supported by towers 104 and 106 of different configurations. Different tower configurations may have different effects on the reactance (due to different distances between conductors, different distances between a conductor and the tower, different distances between a conductor and ground 120, the number and proximity of paths between the conductors and ground 120, and so forth), and accordingly, sections having different tower configurations may have different properties. Section 132 includes another overhead section between towers 106 and 108 of the same type. Section 134 includes an underground section between towers 108 and 112, where the conductors are underground cables 110. Underground section 134 may have a property, such as impedance, that is different from a property of the overhead sections due to its underground configuration. Alternative quantifications may be used in place of impedance, such as, for example, X/R, admittance, line charging capacitance, and the like.

Although FIG. 1 illustrates sections between towers on an electric power system, it should be understood that towers do not necessarily result in a section border. That is, a section may span multiple towers. Sections may be arbitrarily assigned. Sections may be assigned such that each line section between each tower is a separate line section. Sections may be assigned such that each line section between towers of different types is a separate line section. Sections may be assigned such that overhead sections are different sections than underground portions. Various other assignments of sections may be made.

FIG. 1 further illustrates that section 134 includes fault 150 in the underground portion of the A-phase. A fault location algorithm that assumes homogeneity and uses lumped impedance of the electric power line may calculate an erroneous fault location due to the non-homogeneity of power line 100.

IEDs may be in electrical communication with an electric power system, such as the line 100 of FIG. 1. The IEDs may obtain signals from the electric power system in order to monitor, control, and/or protect the electric power system. Using measurements from all three phases, IEDs may be configured to calculate symmetrical components of certain quantities from the electric power system such as, for example, positive-sequence voltages, currents, and the like; negative-sequence voltages, currents, and the like; and zero-sequence voltages, currents, and the like. Such components may be useful in determining a location of a fault on the electric power system.

Figure 2:
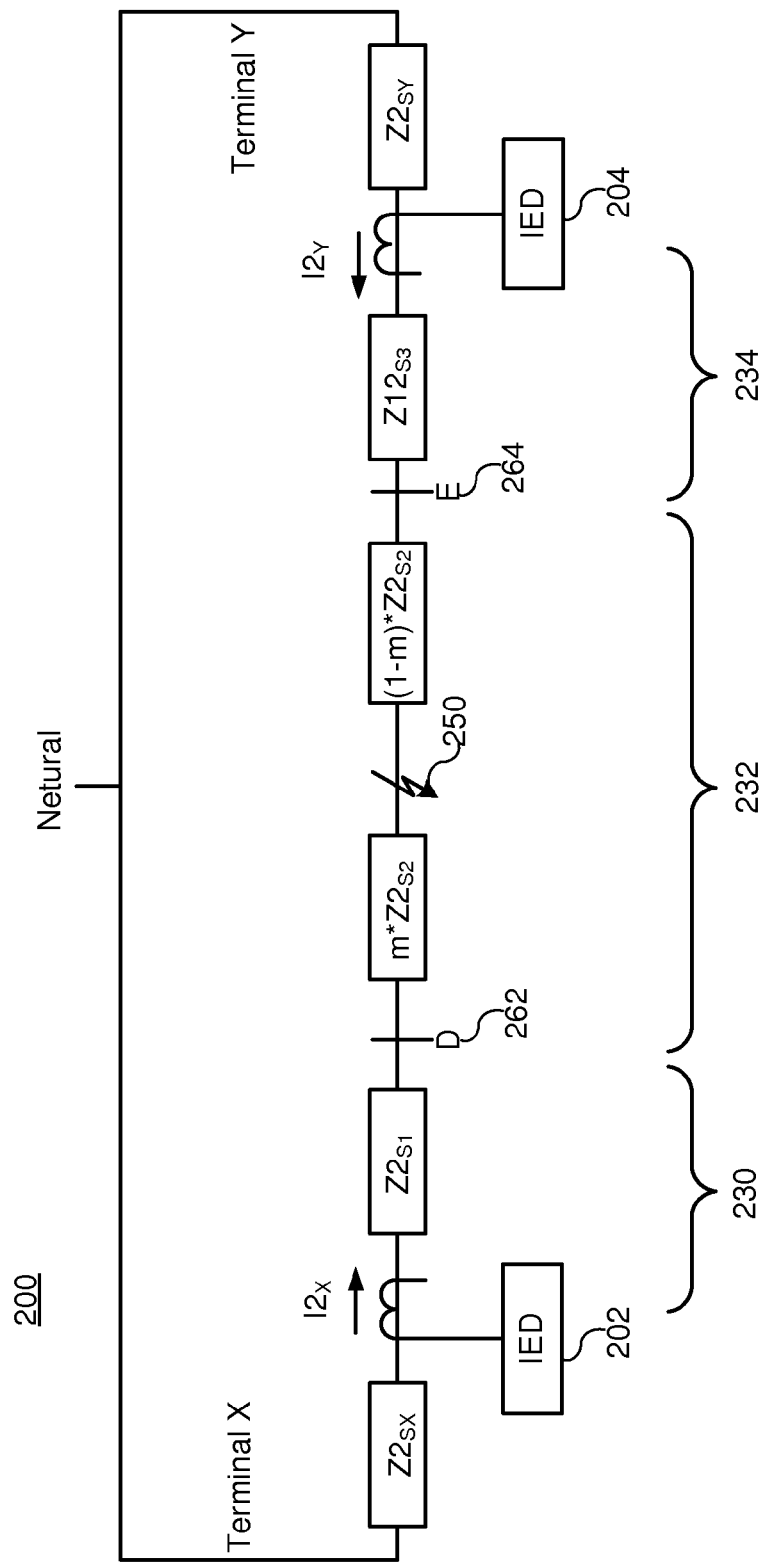
FIG. 2 illustrates a negative-sequence diagram of a power line with various sections.

FIG. 2 illustrates one example of a negative-sequence network 200 of a non-homogeneous electric power line with three sections, namely, a first section 230, a second section 232 and a third section 234. The second section 232 spans between point D 262 and point E 264. One side of the negative-sequence network 200 is denoted as terminal X, whereas the other side is denoted as terminal Y. Terminal X includes a negative-sequence source impedance ($\vec{Z2}_{SX}$), and terminal Y includes a negative-sequence source impedance ($\vec{Z2}_{SY}$). Section 230 includes a negative-sequence impedance ($\vec{Z2}_{S1}$). Section 232 includes a negative-sequence impedance ($\vec{Z2}_{S2}$), that is multiplied on the left side of the fault 250 by m such that m is the per-unit distance to the fault from the left side of the section (point D 262), and a negative-sequence impedance ($\vec{Z2}_{S2}$) may be similarly multiplied by 1−m where 1−m is the per-unit distance to the fault from the right side of the section (point E 264). Section 234 includes a negative-sequence impedance ($\vec{Z2}_{S3}$).

The negative-sequence network 200 illustrated in FIG. 2 includes IED 202 at terminal X and IED 204 at terminal Y. IED 202 and IED 204 may be configured to measure voltages, currents and/or other electric power system quantities using potential transformers (PTs), current transformers (CTs) or the like. Such electric power system quantities may be used to detect a faulted condition on the electric power system and to calculate the location of the fault on the electric power system.

Although FIG. 2 illustrates a negative-sequence network, and several embodiments herein are described using the negative-sequence network, other symmetrical components and symmetrical component networks (e.g. positive-sequence or zero-sequence) may be used to calculate the fault location using techniques described herein. The fault location may be calculated by preparing profiles of power line quantities and comparing the profiles to determine where the profiles cross. The location at which the profiles cross is determined to be the fault location. The profiles may be formed from phase-domain quantities, Clarke components, symmetrical components, or the like. The profiles may be magnitude profiles. It should be understood that as used herein, "profile" indicates a set of at least two results from calculations, and does not necessarily require a continuous line. A "profile" may be made up of phase-domain quantities, Clarke components, symmetrical-component quantities, or the like calculated at different points along a line. For example, a negative-sequence voltage magnitude profile may be made up of negative-sequence voltage magnitudes calculated at different points along an electric power line.

According to an embodiment, determining a fault location on a non-homogeneous line may include preparing profiles of a power line quantity from each terminal of the power line, and determining where the profiles cross. As mentioned above, the profiles may be formed from phase-domain quantities, Clarke components, symmetrical components, or the like. In one example, symmetrical component (such as negative-sequence voltage) magnitude profiles may be prepared by calculating negative-sequence voltage magnitudes as calculated from each terminal at a plurality of locations along the power line using power line information from each section.

Specifically, the symmetrical component magnitude profiles may be formed from symmetrical component quantity magnitudes calculated at various points along the electric power line, which are calculated using measurements obtained at each terminal of the power line and properties of each section. The points may be at predetermined locations, borders between sections, towers, access points, intervals, or the like. Equations 1-4 may be used to prepare a negative-sequence voltage magnitude profile in accordance with this example:

$$V2_{D\_X} = |\vec{V2}_X - \Sigma_{i=1}^{k-1} \vec{Z2}_i * \vec{I2}_X - (m * \vec{Z2}_k * \vec{I2}_X)| \quad \text{Eq. (1)}$$

$$V2_{D\_Y} = |\vec{V2}_Y - \Sigma_{i=k+1}^{N} \vec{Z2}_i * \vec{I2}_Y - ((1-m) * \vec{Z2}_k * \vec{I2}_Y)| \quad \text{Eq. (2)}$$

$$m = d/L_k \quad \text{Eq. (3)}$$

$$d = D - \Sigma_{i=1}^{k-1} L_i \quad \text{Eq. (4)}$$

where:

$V2_{D\_X}$ is the negative-sequence voltage magnitude at point D calculated from measurements taken from terminal X;

$V2_{D\_Y}$ is the negative-sequence voltage magnitude at point D calculated from measurements taken from terminal Y;

$\vec{V2}_X$ is a negative-sequence voltage calculated from measurements at terminal X;

$\vec{V2}_Y$ is a negative-sequence voltage calculated from measurements at terminal Y;

$\vec{I2}_X$ is a negative-sequence current calculated from measurements at terminal X;

$\vec{I2}_Y$ is a negative-sequence current calculated from measurements at terminal Y;

k denotes the section;

D is the point along the length of the line where the symmetrical component quantity is to be calculated;

d is the length along the section k where the symmetrical component quantity is to be calculated;

$\vec{Z2}_k$ is the negative-sequence impedance of section k; and $L_k$ is the length of section k.

Equations 1-4 may be solved for multiple points D along the power line to form the symmetrical component magnitude profiles calculated from measurements from terminal X and terminal Y. The symmetrical component magnitude profiles can then be used to determine which section includes the fault. That is, the section that includes the fault can be determined as the section in which the profiles cross or are equal. This can be accomplished by finding the point D where the symmetrical component magnitude profiles are the closest. Alternatively, this may be accomplished by finding two sequential points D that straddle the intersection of the profiles. That is, the two points satisfy both Equations 5 and 6:

$$V2_{D\_X} \leq V2_{D\_Y} \quad \text{Eq. (5)}$$

$$V2_{D+1\_X} > V2_{D+1\_Y} \quad \text{Eq. (6)}$$

The intersection point must be between D and D+1. Accordingly, the section including D and D+1 is the faulted section.

According to an embodiment, determining a fault location on a non-homogeneous line may include two steps, namely: 1) determining the faulted section; and 2) determining the fault location within the faulted section. Because the line is not homogeneous, the different properties of each section are considered when determining which section is faulted. The properties of the faulted section are used to calculate the location of the fault within the faulted section. By considering the properties of each section, fault location, as described herein, may be more accurate than calculating a fault location on a non-homogeneous line using the assumption that the line is homogeneous.

Determining the faulted section uses the properties of each of the sections along with the measured power system quantities taken at each terminal. These quantities are used to form a symmetrical component magnitude profile from measurements at each terminal. The symmetrical component magnitude profile may include symmetrical component quantities calculated at various points along the line between the terminals. In one embodiment, the symmetrical component magnitude profile is made up of negative-sequence voltage magnitudes calculated at the left and right sides of each section from measurements from each terminal. That is, negative-sequence voltage magnitudes for the left and right sides of each section are calculated using measurements from terminal X, and negative-sequence voltage magnitudes for the left and right sides of each section are calculated using measurements from terminal Y. The section in which such profiles cross or are equal is the faulted section.

In one example, for a line with N line sections, symmetrical component magnitude profiles are formed from symmetrical component quantities calculated using measurements obtained at each terminal of the line and properties of each section. Equations 7-10 may be used to calculate negative-sequence voltage magnitude profiles in accordance with this example:

$$V2_{k\_L\_X} = |\vec{V2}_X - \Sigma_{i=1}^{k-1} \vec{Z2}_i * \vec{I2}_X| \quad \text{Eq. (7)}$$

$$V2_{k\_R\_X} = |\vec{V2}_X - \Sigma_{i=1}^{k} \vec{Z2}_i * \vec{I2}_X| \quad \text{Eq. (8)}$$

$$V2_{k\_L\_Y} = |\vec{V2}_Y - \Sigma_{i=k}^{N} \vec{Z2}_i * \vec{I2}_Y| \quad \text{Eq. (9)}$$

$$V2_{k\_R\_Y} = |\vec{V2}_Y - \Sigma_{i=k+1}^{N} \vec{Z2}_i * \vec{I2}_Y| \quad \text{Eq. (10)}$$

where:

$V2_{k\_L\_X}$ is a negative-sequence voltage magnitude at the left side of section k calculated from measurements from terminal X;

$V2_{k\_R\_X}$ is a negative-sequence voltage magnitude at the right side of section k calculated from measurements from terminal X;

$V2_{k\_L\_Y}$ is a negative-sequence voltage magnitude at the left side of section k calculated from measurements from terminal Y;

$V2_{k\_R\_Y}$ is a negative-sequence voltage magnitude at the right side of section k calculated from measurements from terminal Y;

$\vec{V2}_X$ is a negative-sequence voltage calculated from measurements at terminal X;

$\vec{V2}_Y$ is a negative-sequence voltage calculated from measurements at terminal Y;

$\vec{I2}_X$ is a negative-sequence current calculated from measurements at terminal X;

$\vec{I2}_Y$ is a negative-sequence current calculated from measurements at terminal Y;

k denotes the section;

N denotes the number of sections; and, $\vec{Z2}_i$ is a negative-sequence impedance of the section i.

Using the results from the above, the faulted section may be determined by identifying the section in which: 1) the negative-sequence voltage magnitude at the left side of the section calculated from measurements from terminal X is less than or equal to the negative-sequence voltage magnitude at the left side of the section calculated from measurements from terminal Y; and 2) the negative-sequence voltage magnitude at the right side of the section calculated from terminal Y is less than the negative-sequence voltage magnitude at the right side of the section calculated from terminal X. Equations 11 and 12 may be used to identify the faulted section:

$$V2_{k\_L\_X} \leq V2_{k\_L\_Y} \quad \text{Eq. (11)}$$

$$V2_{k\_R\_Y} < V2_{k\_R\_X} \quad \text{Eq. (12)}$$

Figure 3:
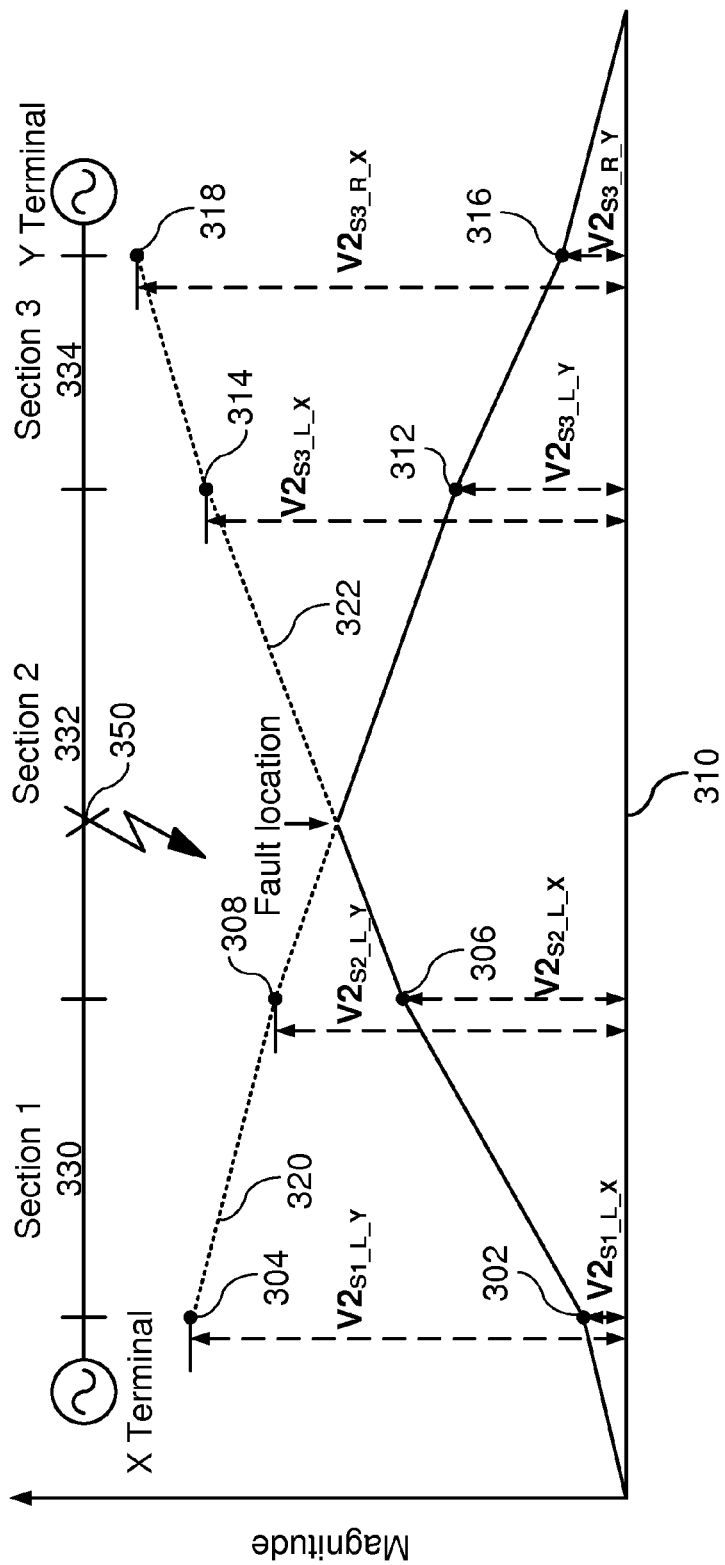
FIG. 3 illustrates a plot of a negative-sequence voltage magnitude profile measured from terminals X and Y of a power line with a fault in section 2.

FIG. 3 illustrates an example of a negative-sequence voltage magnitude profile from measurements taken from terminals X and Y of a non-homogeneous electric power line with three sections. Properties of length and negative-sequence impedance exist for each section 330, 332, 334. Each terminal includes a source having a negative-sequence impedance $\vec{Z2}_{SX}$, and $\vec{Z2}_{SY}$, respectively. Negative-sequence voltage magnitudes are calculated at the left and right sides of each section, resulting in the illustrated negative-sequence voltage magnitude profiles 320, 322.

Specifically, profile 322 is formed from negative-sequence voltage magnitudes calculated using measurements from terminal X. The points at which voltage magnitudes are calculated are at the left and right sides of each section. Profile 320 is formed from negative-sequence voltage magnitudes calculated using measurements from terminal Y at the left and right sides of each section. The negative-sequence voltage magnitudes are calculated using Equations 13-18:

$$V2_{S2\_L\_X} = |\vec{V2}_X - \vec{Z2}_{S1} * \vec{I2}_X| \quad \text{Eq. (13)}$$

$$V2_{S3\_L\_X} = |\vec{V2}_X - (\vec{Z2}_{S1} + \vec{Z2}_{S2}) * \vec{I2}_X| \quad \text{Eq. (14)}$$

$$V2_{S3\_R\_X} = |\vec{V2}_X - (\vec{Z2}_{S1} + \vec{Z2}_{S2} + \vec{Z2}_{S3}) * \vec{I2}_X| \quad \text{Eq. (15)}$$

$$V2_{S3\_L\_Y} = |\vec{V2}_Y - \vec{Z2}_{S3} * \vec{I2}_Y| \quad \text{Eq. (16)}$$

$$V2_{S2\_L\_Y} = |\vec{V2}_Y - (\vec{Z2}_{S3} + \vec{Z2}_{S2}) * \vec{I2}_Y| \quad \text{Eq. (17)}$$

$$V2_{S1\_L\_Y} = |\vec{V2}_Y - (\vec{Z2}_{S1} + \vec{Z2}_{S2} + \vec{Z2}_{S3}) * \vec{I2}_Y| \quad \text{Eq. (18)}$$

where:

$\vec{V2}_X$ is the negative-sequence voltage measured at terminal X;

$\vec{V2}_Y$ is the negative-sequence voltage measured at terminal Y;

$\vec{I2}_X$ is the negative-sequence current measured at terminal X;

$\vec{I2}_Y$ is the negative-sequence current measured at terminal Y;

$\vec{Z2}_{S1}$, $\vec{Z2}_{S2}$, and $\vec{Z2}_{S3}$ are the negative-sequence impedances of line sections 1, 2, and 3, respectively;

$V2_{S2\_L\_X}$ and $V2_{S3\_L\_X}$ are negative-sequence voltage magnitudes at the left sides of sections 2 and 3, respectively, calculated from measurements from terminal X;

$V2_{S1\_L\_Y}$, and $V2_{S3\_L\_Y}$ are negative-sequence voltage magnitudes at the left sides of sections 1 and 3, respectively, calculated from measurements from terminal Y;

$V2_{S3\_R\_X}$ is a negative-sequence voltage magnitude at the right side of section 3, calculated from measurements from terminal X; and $V2_{S2\_L\_Y}$ is a negative-sequence voltage magnitude at the left side of section 2, calculated from measurements from terminal Y.

Turning particularly to the example illustrated in FIG. 3, the negative-sequence voltage magnitude profiles for a power line are calculated from terminal X and terminal Y. The profile 322 calculated from terminal X includes calculations of negative-sequence voltage magnitude at terminal X 302, at the left side of section 2 (also noted as the right side of section 1) 306, at the left side of section 3 (also noted as the right side of section 2) 314, and at the right side of section 3 (also noted as terminal Y) 318. The profile 320 calculated from terminal Y includes calculations of negative-sequence voltage magnitude at terminal Y 316, the left side of section 3 (also noted as the right side of section 2) 312, the left side of section 2 (also noted as the right side of section 1) 308, and at the left side of section 1 (also noted as terminal X) 304. As illustrated, profiles 320 and 322 intersect at the fault location 310, which is in the faulted section. Accordingly, determination of the faulted section may be done by determining in which section the profiles intersect. In the example depicted in FIG. 3, the fault 350 is in section 332.

Figure 4:
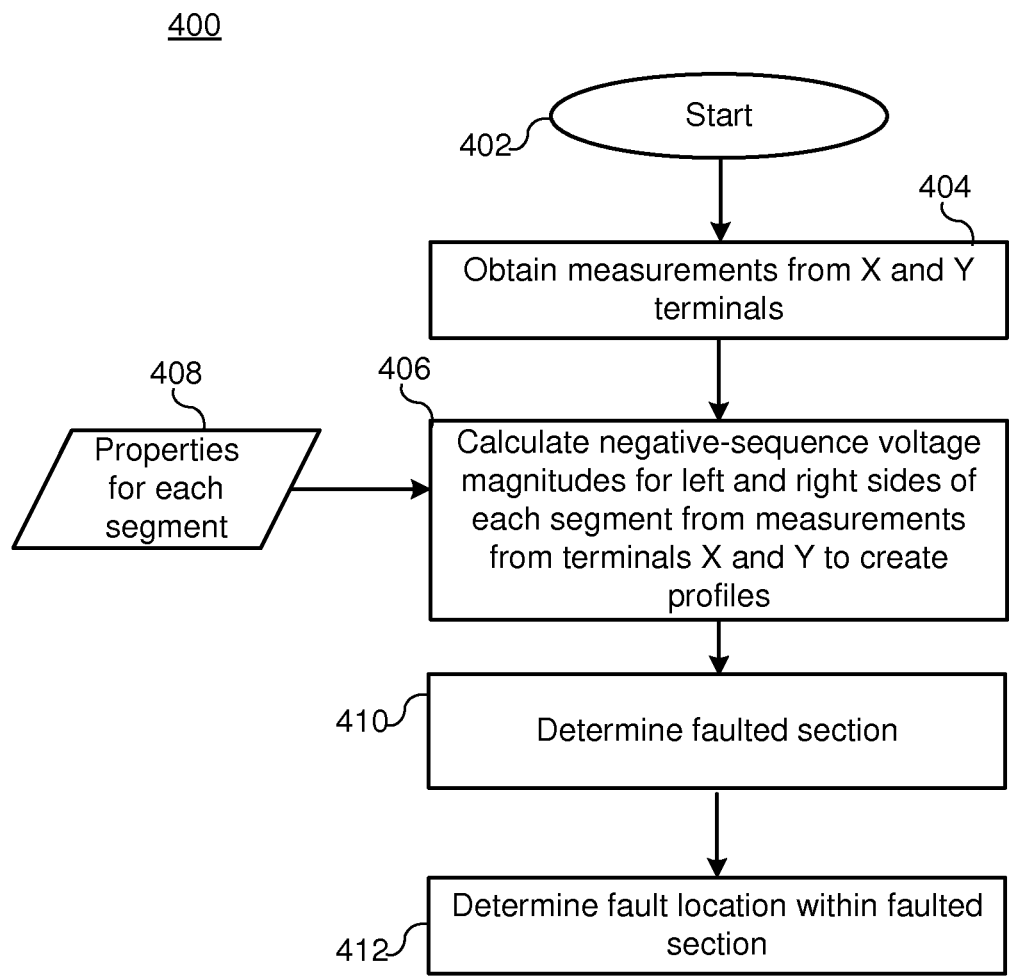
FIG. 4 illustrates a flow diagram of a method for determining the faulted section and fault location on a power line with various sections.

FIG. 4 illustrates a process flow diagram of a method 400 for determining a faulted line section of a non-homogeneous electric power line with a plurality of sections. Method 400 starts 402 once a fault has been detected, by obtaining measurements from terminal X and terminal Y 404. With those measurements, as has been described in more detail herein, method 400 calculates negative-sequence voltage magnitudes for left and right sides of each section from measurements from terminals X and Y to create voltage profiles 406. Properties from each section 408 may be used to calculate the voltage magnitude profiles, as has been described in more detail hereinabove. Once the magnitudes have been calculated and the profiles have been calculated, method 400 determines which section is the faulted section 410. This may be done using Equations 5 and 6, or 11 and 12, or by determining at which points the profiles cross or are closest to each other, as has been described hereinabove. Once the faulted section has been identified, method 400 determines the fault location within the faulted section 412.

Figure 5:
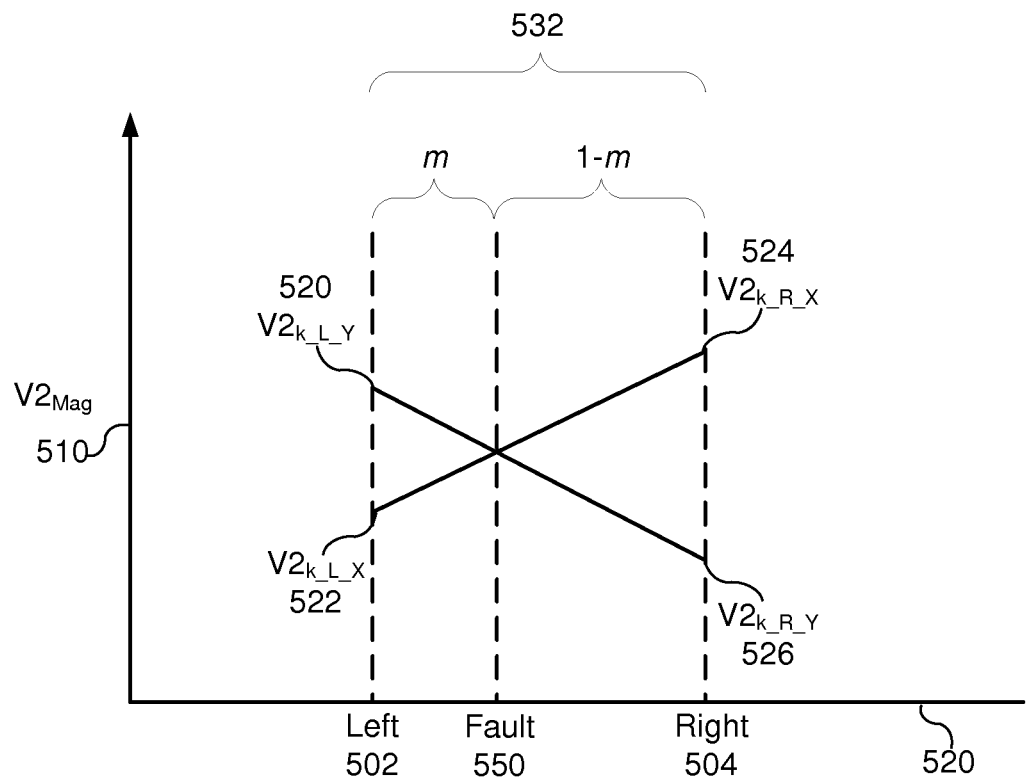
FIG. 5 illustrates a plot of negative-sequence voltage magnitude profiles of a faulted section calculated from two terminals of a power line.

FIG. 5 illustrates a symmetrical-component magnitude profile diagram for the faulted section 532 of an electric power line with a plurality of sections. For this example, the symmetrical-component magnitude profiles are made up of negative-sequence voltage magnitudes $V2_{Mag}$, which are plotted on the ordinate 510 where the length of the section is plotted on the abscissa 520. The profile, as calculated from terminal X, begins at the left side 502 of the section with the voltage magnitude $V2_{k\_L\_X}$ 522 and continues to the right side 504 of the section with the voltage magnitude $V2_{k\_R\_X}$ 524. The profile, as calculated from terminal Y, begins at the right side 504 of the section with the voltage magnitude $V2_{k\_R\_Y}$ 526 and continues to the left side 502 of the section with the voltage magnitude $V2_{k\_L\_Y}$ 520. The profiles intersect at the point of the fault 550. At the fault location 550 m can be determined as the ratio of the length from the left side 502 to the fault location 550 over the length of the section 532.

The fault location within the faulted section may be determined by iteratively solving equations to determine the point along the faulted section where the symmetrical-component magnitude profiles are equal, or iteratively solving equations to a point within an acceptable error of the fault location.

As the negative-sequence voltage magnitudes calculated from each terminal should be equal to each other at the fault location Equation 19 will be true at the fault location. Accordingly, the location of the fault in terms of m may be calculated by solving for m:

$$|\vec{V2}_{k\_L\_X} - m*\vec{Z2}_k*\vec{I2}_X| = |\vec{V2}_{k\_R\_Y} - (1-m)*\vec{Z2}_k*\vec{I2}_Y| \quad \text{Eq. (19)}$$

where:

$\vec{V2}_{k\_L\_X}$ is the negative-sequence voltage at the left side of section k calculated from terminal X; and $\vec{V2}_{k\_R\_Y}$ is the negative-sequence voltage at the right side of section k calculated from terminal Y.

Several numeric methods may be used to iteratively solve for the fault location (such as m in Equation 19). One such method is the binary search method (BSM), wherein an initial guess is used to determine if the fault location is at the initial guess. If not, BSM attempts another guess based on whether the previous guess was too high or too low. The method iterates through subsequent guesses until predetermined search criteria are satisfied. For example, the search criteria may use two sequential guesses that are within a certain distance from each other or a certain percentage of each other. Predetermined criteria may further be a predetermined number of iterations, or the like.

In another example, once the faulted section is determined, the fault location may be determined by further refining the faulted section and refining the voltage magnitude profile within the section to more accurately calculate the location of the fault. That is, Equations 1-4 may be used at various points D within the faulted section to refine the voltage magnitude profiles, and Equations 5 and 6 can be used to identify the two points D that straddle the intersection of the profiles to determine the fault location.

Figure 6:
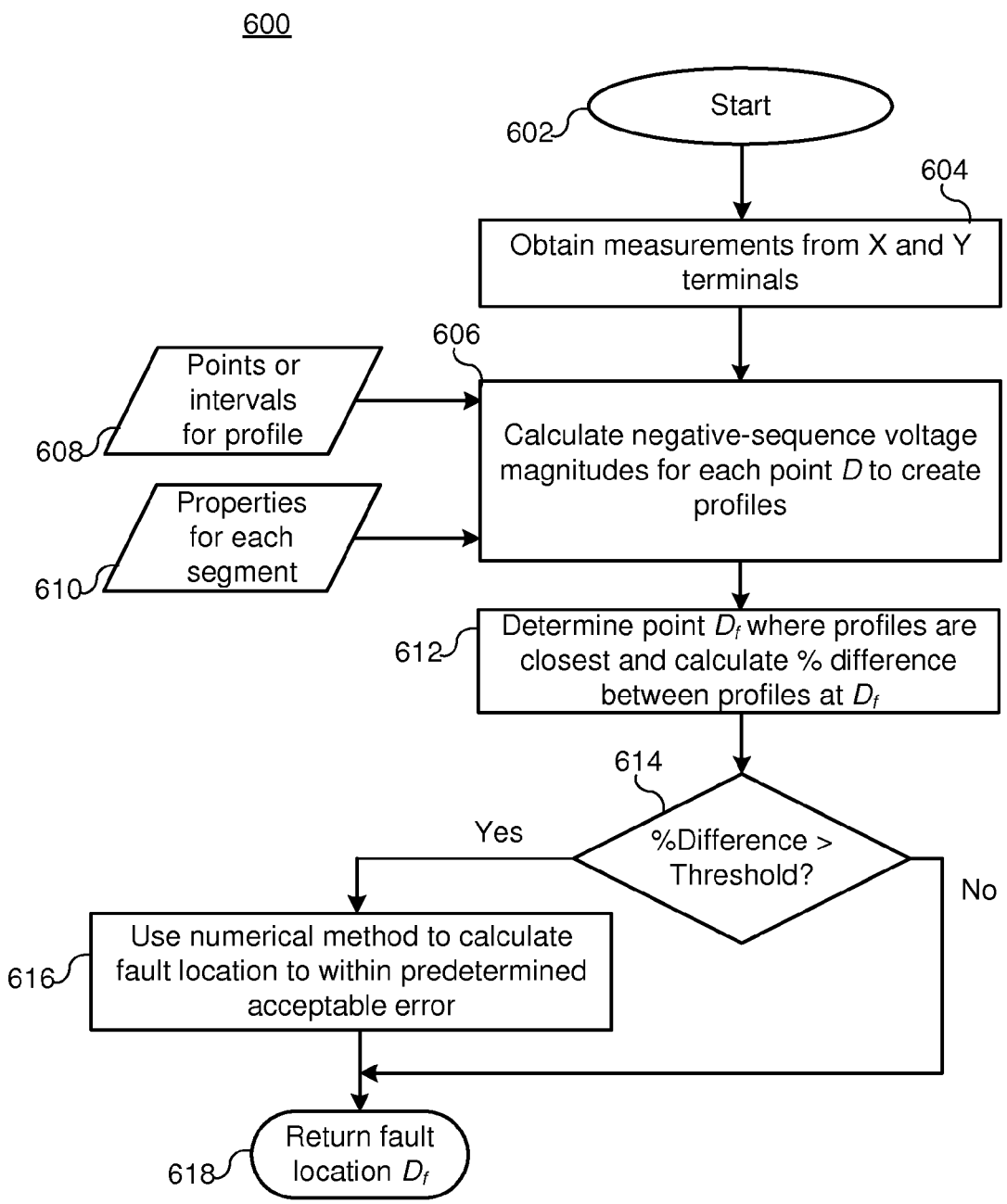
FIG. 6 illustrates a flow diagram of a method for determining a fault location of a non-homogeneous power line with a plurality of sections.

Although certain of the above-described fault location embodiments involve two general steps of determining a faulted section and calculating the fault location within that section, in one embodiment the fault location is determined from the symmetrical-component magnitude profile directly. FIG. 6 illustrates a flow chart of one such method for determining the fault location of a non-homogeneous electric power line with a plurality of sections directly. The method 600 starts 602 upon detection of a fault within an electric power line. Measurements from terminal X and terminal Y are obtained 604. These measurements are then used to calculate negative-sequence voltage magnitudes at each point D along the power line to create the magnitude profiles 606. In one example, a negative-sequence voltage magnitude profile may be created using Equations 1-4 at points D along the electric power line. Points D may be chosen at intervals, at each tower, at each access point, or the like. In another example, a negative-sequence voltage magnitude profile may be created using Equations 7-10 at points at each border between sections. In order to create the profiles, the properties for each line section 610 (previously entered or calculated) are read, input, or made available to the method. Further, a list of predetermined points D at which the profile is to be calculated, or information as to the intervals at which the profile is to be calculated (previously entered) are read, input, or made available to the method 608 such that the list of points D at which the profile is to be calculated is known to the method. Once the profiles are created 606, the method determines the point $D_f$ at which the profiles are closest. The point $D_f$ may be one of the points D where the profiles were calculated.

Method 600 may also determine the percent difference between the two profiles at point $D_f$ 612 and determine if the percent difference is greater than a predetermined threshold 614. If the percent difference is less than a predetermined threshold, then the method concludes by returning the fault location as the point $D_f$ 618. If, however, the percent difference is greater than a predetermined threshold, then the method may further refine the calculation of the fault location by performing further search calculations near point $D_f$ to find a new point $D_f$ where the profiles are closer or equal 616. The further refinement may use the BSM or other search technique. The further refinement may simply calculate the negative-sequence voltage magnitudes at points near $D_f$ to find a new point where the profiles are closer, calculate a percent difference, and test the percent difference against a predetermined threshold. Once the method has calculated the fault location to within a predetermined acceptable error, the method returns the fault location as the point $D_f$ 618.

In one specific embodiment, method 600 calculates the negative-sequence voltage magnitude profile (which is one of a number of symmetrical-component magnitude profiles that can be created) at intervals along the line. The intervals may be determined such that the point with the closest profiles is within the acceptable error. For example, the line may be divided into 100 equal intervals with the profiles calculated at each interval. The result would be a fault location that is within 1% of the line distance to the fault without further refinement, such as that in 616.

Figure 7A:
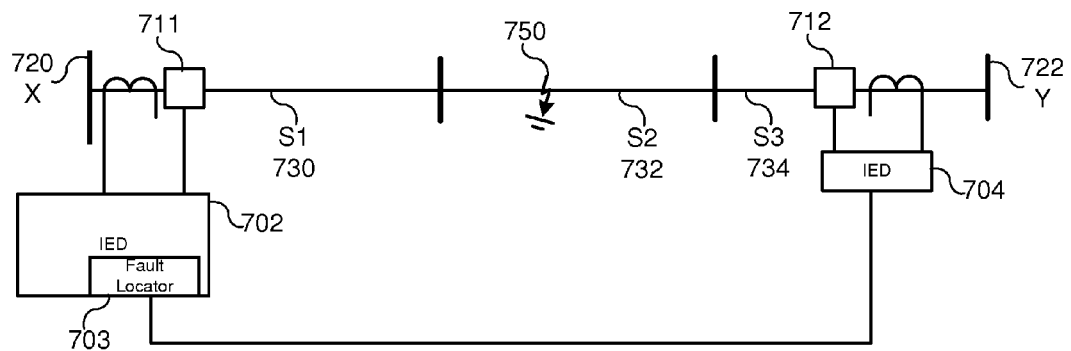
FIGS. 7A and 7B illustrate systems for determining the fault location of a power line with a plurality of sections.
Figure 7B:
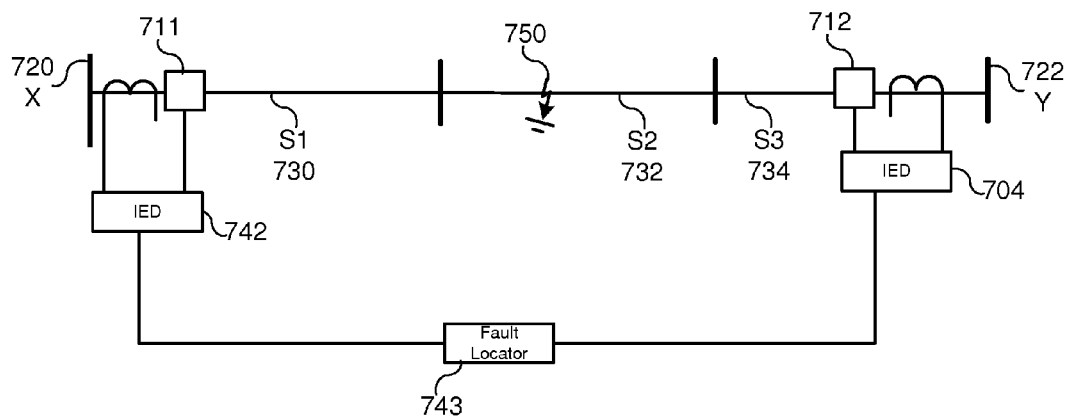

The fault location described herein may be implemented to locate faults on an electric power line that is monitored by IEDs. FIGS. 7A and 7B illustrate simplified one-line diagrams of electric power lines employing IEDs to monitor such lines and locate faults thereon. FIG. 7A illustrates one such line 700A with three sections S1 730, S2 732, and S3 734 between terminal X 720 and terminal Y 722. IED 702 is in communication with the line 700A near terminal X 720 and may obtain measurements therefrom using CTs, PTs, or the like. IED 702 obtains measurements from line 700A and performs calculations thereon for monitoring the line. IED 702 may further operate a circuit breaker, such as circuit breaker 711, based on the results of its calculations, commands from other devices, or the like. IED 704 is in communication with the electric power line near terminal Y 722. IED 704 similarly obtains measurements from the power line near terminal Y 722 using CTs, PTs, or the like. IED 704 may operate circuit breaker 712. IEDs 702 and 704 may further be configured to determine a location of fault 750 on the line 700A. IED 702 includes a fault locator 703 configured to perform the fault location determinations, as described herein. IED 704 is in communication with IED 702 such that measurements and/or calculations from IED 704 are communicated to IED 702, and specifically to the fault locator 703 for calculating the fault location. IED 704 may communicate measurements from the power line, or may communicate calculations from those measurements. For example, if the symmetrical-component profile to be determined is a negative-sequence quantity magnitude profile, then IED 704 may calculate the negative-sequence current magnitude at the various locations along the line 700A (for example, at terminal Y and at the left and/or right sides of each section). Alternatively, IED 704 may communicate measurements or other such data as measured currents, voltages, phasors, time stamps, symmetrical components, to IED 702 for further calculation therewithin. Fault locator 703 may then use such measurements and/or data from IED 702 and IED 704 to calculate a fault location as described herein.

FIG. 7B illustrates yet another simplified one-line diagram of an electric power line 700B monitored by IEDs 704 and 742. In this system, a fault locator 743 is a separate device from IEDs 704 and 742. IEDs 704 and 742 may operate as IED 704 in FIG. 7A in that they may collect and send measurements and/or processed data to fault locator 743 in the event of a fault. Fault locator 743 then operates to calculate the location of the fault as described herein.

Although several of the embodiments described herein use negative-sequence impedances and calculate negative-sequence voltage magnitude profiles, other symmetrical component quantities and profiles may be used to calculate a fault location. For example, if the fault is a balanced fault, positive-sequence impedances may be used and positive-sequence voltage magnitude profiles may be calculated to determine the faulted section and/or the fault location.

Figure 8:
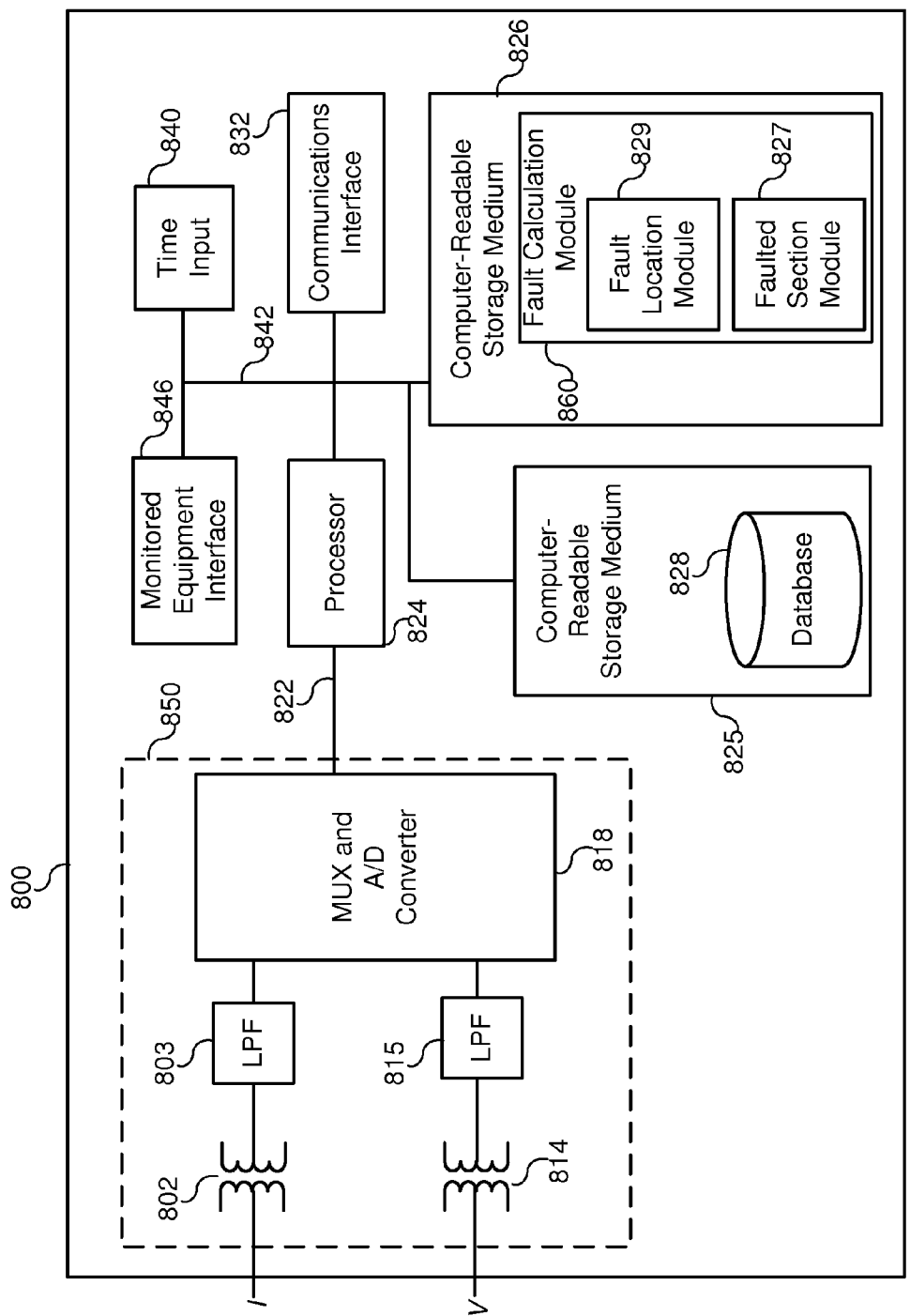
FIG. 8 illustrates a block diagram of an intelligent electronic device (IED) used for fault location in an electric power line.

FIG. 8 illustrates a block diagram of an IED 800 configured to calculate a fault location on a non-homogeneous electric power line with a plurality of sections. IED 800 includes a communications interface 832 configured to communicate with other IEDs. The communications interface 832 may facilitate direct communication with another IED or communicate with another IED over a communications network. Communications interface 832 may facilitate communications with multiple IEDs. For example, if the IED 800 is a fault locator, such as fault locator 743 of FIG. 7B, it receives data from IEDs at each terminal of the power line. IED 800 also may include a time input 840, which may be used to receive a time signal, such that it may include a time-stamp on communications therefrom, and/or it may synchronize sampling with other IEDs. In certain embodiments, a common time reference may be received via communications interface 832, and accordingly, a separate time input would not be necessary. One such embodiment may employ the IEEE 1588 protocol. A monitored equipment interface 846 may be configured to receive status information from, and issue control instructions to a piece of monitored equipment (such as a circuit breaker, conductor, transformer, or the like).

A computer-readable storage medium 825 may be the repository of a database 828 containing specific electric power line properties for each section, such as impedances, resistances, reactances, lengths, and the like, as well as points D at which the voltage magnitude profile is to be calculated (which may be at the ends of sections, locations of towers or access points, intervals, or the like). Another computer-readable storage medium 826 may be the repository of various software modules configured to perform any of the methods described herein, such as a fault calculation module 860 that includes computer instructions for calculating the location of a fault on a non-homogeneous electric power line with a plurality of sections. The fault calculation module 860 may further include sub-modules, such as a faulted section module 827, that includes computer instructions for determining which section is the faulted section (as further detailed herein) and fault location module 829 that includes computer instructions for determining the location of the fault on the faulted section (as further detailed herein). A data bus 842 may link monitored equipment interface 846, time input 840, communications interface 832, and computer-readable storage mediums 825 and 826 to a processor 824.

Computer-readable storage mediums 825 and 826 may be the same medium (i.e. the same disk, the same non-volatile memory device, or the like) or separate mediums as illustrated. Further, the database 828 may be stored in a computer-readable storage medium that is not part of the IED 800, but that is accessible to the processor using, for example, a data bus, a computer network, or the like.

Processor 824 may be configured to process communications received via communications interface 832, time input 840, and monitored equipment interface 846. Processor 824 may operate using any number of processing rates and architectures. Processor 824 may be configured to perform various algorithms and calculations described herein. Processor 824 may be embodied as a general purpose integrated circuit, an application specific integrated circuit, a field-programmable gate array, and other programmable logic devices.

In certain embodiments, IED 800 may include a sensor component 850. For example, if an IED is used as IED 702 of FIG. 7A, it would receive power line information from the power line. In the illustrated embodiment, sensor component 850 is configured to gather data directly from a conductor (not shown) and may use, for example, transformers 802 and 814, filters (such as low-pass filters) 803 and 815. A multiplexer and analog-to-digital converter 818 may sample and/or digitize the filtered waveforms to form corresponding digitized current and voltage signals 822.

In other embodiments, sensor component 850 may be configured to monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, and the like.

A/D converter 818 may be connected to processor 824 by way of a bus 822, through which digitized representations of current and voltage signals may be transmitted to processor 824. In various embodiments, the digitized current and voltage signals may be used to calculate the location of a fault on the electric power line as described herein.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A method for determining a location of a fault on a non-homogeneous electric power line with a plurality of sections, the method comprising:
    calculating, using a fault locator device configured to interface with an electric power distribution system, a first profile of a power system quantity using measurements from a first terminal of the electric power line by calculating a plurality of negative-sequence voltage magnitudes at the left side and a plurality of negative-sequence voltage magnitudes at the right side of each section from measurements from the first terminal;
    calculating using the fault locator device a second profile of the power system quantity using measurements from a second terminal of the electric power line by calculating a plurality of negative-sequence voltage magnitudes at the left side and a plurality of negative-sequence voltage magnitudes at the right side of each section from measurements from the second terminal; and
    calculating using the fault locator device a fault location by determining a point at which the first profile is closest to the second profile.

2. The method of claim 1, wherein the first and second profiles comprise negative-sequence voltage magnitude profiles.

3. The method of claim 1, wherein the fault comprises a balanced fault and the first and second profiles comprise positive-sequence voltage magnitude profiles.

4. The method of claim 1, wherein the first and second profiles comprise one selected from the group consisting of: phase-domain quantity profiles; Clarke component profiles; and, symmetrical-component quantity profiles.

5. The method of claim 1, wherein calculating the first profile comprises calculating quantities at a plurality of locations along the electric power line using measurements at the first terminal and a property of each section.

6. The method of claim 5, wherein the property of each section comprises an impedance of each section.

7. The method of claim 5, wherein the property of each section comprises a length of each section.

8. The method of claim 1, wherein:

calculating the plurality of negative-sequence voltage magnitudes at the left side of each section from measurements from the first terminal uses:

$$V2_{k\_L\_X}=|\vec{V2}_X-\Sigma_{i=1}^{k-1}\vec{Z2}_i*\vec{I2}_X|;$$

calculating the plurality of negative-sequence voltage magnitudes at the right side of each section from measurements from the first terminal uses:

$$V2_{k\_R\_X}=|\vec{V2}_X-\Sigma_{i=1}^{k}\vec{Z2}_i*\vec{I2}_X|;$$

calculating the plurality of negative-sequence voltage magnitudes at the left side of each section from measurements from the second terminal uses:

$$V2_{k\_L\_Y}=|\vec{V2}_Y-\Sigma_{i=k}^{N}\vec{Z2}_i*\vec{I2}_Y|; \text{ and}$$

calculating the plurality of negative-sequence voltage magnitudes at the right side of each section from measurements from the second terminal uses:

$$V2_{k\_R\_Y}=|\vec{V2}_Y-\Sigma_{i=k+1}^{N}\vec{Z2}_i*\vec{I2}_Y|;$$

where:
- $V2_{k\_L\_X}$ comprises a negative-sequence voltage magnitude at the left side of section k calculated from measurements from the first terminal;
- $V2_{k\_R\_X}$ comprises a negative-sequence voltage magnitude at the right side of section k calculated from measurements from the first terminal;
- $V2_{k\_L\_Y}$ comprises a negative-sequence voltage magnitude at the left side of section k calculated from measurements from the second terminal;
- $V2_{k\_R\_Y}$ comprises a negative-sequence voltage magnitude at the right side of section k calculated from measurements from the second terminal;
- $\vec{V2}_X$ comprises a negative-sequence voltage calculated from measurements at the first terminal;
- $\vec{V2}_Y$ comprises a negative-sequence voltage calculated from measurements at the second terminal;
- $\vec{I2}_X$ comprises a negative-sequence current calculated from measurements at the first terminal;
- $\vec{I2}_Y$ comprises a negative-sequence current calculated from measurements at the second terminal;
- k comprises the section; and,
- $\vec{Z2}_i$ comprises a negative-sequence impedance of the section.

9. The method of claim 1, further comprising:
determining a faulted section by determining the section wherein:

the negative-sequence voltage magnitude at the left side of the section calculated from measurements from the first terminal is less than or equal to the negative-sequence voltage magnitude at the left side of the section calculated from the measurements from the second terminal; and the negative-sequence voltage magnitude at the right side of the section calculated from measurements from the second terminal is less than the negative-sequence voltage magnitude at the right side of the section calculated from the measurements from the first terminal.

10. The method of claim 1, further comprising the steps of:
determining a faulted section; and
calculating a fault location within the faulted section.

11. The method of claim 10, wherein determining the fault location within the faulted section comprises a numeric method to determine where the first profile is within a specified range of the second profile.

12. The method of claim 10, wherein determining the location of the fault within the faulted section comprises calculating a ratio of the length to the fault along the faulted section to the length of the section.

13. The method of claim 12, wherein the ratio comprises m, and m is calculated using:

$$|\vec{V2}_{k\_L\_X}-m*\vec{Z2}_k*\vec{I2}_X|=|\vec{V2}_{k\_R\_Y}-(1-m)*\vec{Z2}_k*\vec{I2}_Y|$$

where:
- $\vec{V2}_{k\_L\_X}$ comprises a negative-sequence voltage at the left side of the k section calculated from the first terminal;
- $\vec{V2}_{k\_R\_Y}$ comprises a negative-sequence voltage at the right side of the k section calculated from the second terminal;
- $\vec{Z2}_k$ comprises a negative-sequence impedance of the k section;
- $\vec{I2}_Y$ comprises a negative-sequence current measured at the second terminal; and
- $\vec{I2}_X$ comprises a negative-sequence current measured at the first terminal.

14. The method of claim 1, wherein the first profile comprises negative-sequence voltage magnitudes and the second profile comprises negative-sequence voltage magnitudes, and are calculated using:

$$V2_{D\_X}=|\vec{V2}_X-\Sigma_{i=1}^{k-1}\vec{Z2}_i*\vec{I2}_X-(m*\vec{Z2}_k*\vec{I2}_X)|$$

$$V2_{D\_Y}=|\vec{V2}_Y-\Sigma_{i=k+1}^{N}\vec{Z2}_i*\vec{I2}_Y-((1-m)*\vec{Z2}_k*\vec{I2}_Y)|$$

$$m=d/L_k$$

$$d=D-\Sigma_{i=1}^{k-1}L_i$$

where:
- $V2_{D\_X}$ comprises a negative-sequence voltage magnitude at point D calculated from measurements taken from the first terminal;
- $V2_{D\_Y}$ comprises a negative-sequence voltage magnitude at point D calculated from measurements taken from the second terminal;
- $\vec{V2}_X$ comprises a negative-sequence voltage at the first terminal calculated from measurements taken from the first terminal;

$\vec{V2}_Y$ comprises a negative-sequence voltage at the second terminal calculated from measurements taken from the second terminal;

$\vec{I2}_X$ comprises a negative-sequence current calculated from measurements taken from the first terminal;

$\vec{I2}_Y$ comprises a negative-sequence current calculated from measurements taken from the second terminal;

d comprises a point along the length of the line where the symmetrical component power quantity is to be calculated;

$\vec{Z2}_k$ comprises a negative-sequence impedance of section k;

d comprises a length along the section k where the symmetrical component power quantity is to be calculated;

N comprises the number of sections; and $L_k$ comprises the length of section k.

15. The method of claim 14, wherein each point D comprises a tower along the power line.

16. The method of claim 1, wherein the fault location comprises a section that includes the fault.

17. A system for determining a location of a fault on a non-homogeneous electric power line with a first terminal, a second terminal, and a plurality of sections therebetween, the system comprising:
    a fault locator comprising:
        an input for receiving electric power line information from the first terminal and electric power line information from the second terminal;
        a memory comprising a representation of a physical property for each of the plurality of sections, the physical property distinguishing at least one of the plurality of sections from at least one other section;
        a processor for executing computer instructions;
        a fault calculation module executable on the processor and using the physical properties for each of the plurality of sections, the electric power line information from the first terminal, and the electric power line information from the second terminal to create a first profile from measurements from the first terminal and a second profile from measurements from the second terminal and
        using the first and second profiles to determine the location of the fault.

18. The system of claim 17, wherein a first intelligent electronic device (IED) comprises the fault locator, the IED being in electrical communication with the first terminal, the system comprising:
    a second IED in electrical communication with the second terminal and configured to communicate electric power line information from the second terminal to the first IED.

19. The system of claim 17, wherein the system further comprises:
    a first IED in electrical communication with the first terminal and configured to communicate electric power line information from the first terminal to the fault locator; and
    a second IED in electrical communication with the second terminal and configured to communicate electric power line information from the second terminal to the fault locator; and wherein the input for receiving electric power line information is in communication with the first IED and the second IED for receiving electric power line information therefrom.

20. The system of claim 17, wherein the electric power system information received via the input comprises voltage and current measurements.

21. The system of claim 17, wherein the electric power system information received via the input comprise a symmetrical component of an electric power system quantity.

22. The system of claim 17, wherein the first and second profiles comprise negative-sequence voltage magnitude profiles.

23. The system of claim 17, wherein the fault comprises a balanced fault and the first and second profiles comprise positive-sequence voltage magnitude profiles.

24. The system of claim 17, wherein the first and second profiles comprise one selected from the group consisting of: phase-domain quantity profiles; Clarke component profiles; and, symmetrical-component quantity profiles.

25. The system of claim 17, wherein calculating a first profile comprises calculating a plurality of symmetrical component magnitudes at a plurality of locations along the electric power line using measurements at the first terminal and the physical property for each section.

26. The system of claim 25, wherein the physical property for each section comprise negative-sequence impedance for each section.

27. The system of claim 25, wherein the physical property for each section comprises a length for each section.

28. The system of claim 17, wherein the fault calculation module comprises instructions for executing the steps of:
    calculating the first profile comprises calculating a plurality of negative-sequence voltage magnitudes at the left side and calculating a plurality of negative-sequence voltage magnitudes at the right side of each section from measurements from the first terminal; and
    calculating the second profile comprises calculating a plurality of negative-sequence voltage magnitudes at the left side and calculating a plurality of negative-sequence voltage magnitudes at the right side of each section from measurements from the second terminal.

29. The system of claim 28, wherein:
    calculating the plurality of negative-sequence voltage magnitudes at the left side of each section from information from the first terminal uses:

$$V2_{k\_L\_X} = |\vec{V2}_X - \Sigma_{i=1}^{k-1} \vec{Z2}_i * \vec{I2}_X|;$$

calculating the plurality of negative-sequence voltage magnitudes at the right side of each section from information from the first terminal uses:

$$V2_{k\_R\_X} = |\vec{V2}_X - \Sigma_{i=1}^{k} \vec{Z2}_i * \vec{I2}_X|;$$

calculating the plurality of negative-sequence voltage magnitudes at the left side of each section from information from the second terminal uses:

$$V2_{k\_L\_Y} = |\vec{V2}_Y - \Sigma_{i=k}^{N} \vec{Z2}_i * \vec{I2}_Y|; \text{ and}$$

calculating the plurality of negative-sequence voltage magnitudes at the right side of each section from information from the second terminal uses:

$$V2_{k\_R\_Y} = |\vec{V2}_Y - \Sigma_{i=k+1}^{N} \vec{Z2}_i * \vec{I2}_Y|;$$

where:
- V2k_L_X comprises a negative-sequence voltage magnitude at the left side of section k calculated from information from the first terminal;
- V2k_R_X comprises a negative-sequence voltage magnitude at the right side of section k calculated from information from the first terminal;
- V2k_L_Y comprises a negative-sequence voltage magnitude at the left side of section k calculated from information from the second terminal;
- V2k_R_Y comprises a negative-sequence voltage magnitude at the right side of section k calculated from information from the second terminal;
- $\vec{V2}_X$ comprises a negative-sequence voltage calculated from information at the first terminal;
- $\vec{V2}_Y$ comprises a negative-sequence voltage calculated from information at the second terminal;
- $\vec{I2}_X$ comprises a negative-sequence current calculated from information at the first terminal;
- $\vec{I2}_Y$ comprises a negative-sequence current calculated from information at the second terminal;
- k comprises the section; and,
- $\vec{Z2}_i$ comprises a negative-sequence impedance of the section.

30. The system of claim 28, wherein the fault calculation module comprises:
a faulted section calculation module that includes instructions for determining the faulted section by determining a section in which the first symmetrical component magnitude profile is equal to the second symmetrical component magnitude profile.

31. The system of claim 30, wherein the faulted section is the section wherein the negative-sequence voltage magnitude at the left side of the section calculated from information from the first terminal is less than or equal to the negative-sequence voltage magnitude at the left side of the section calculated from the information from the second terminal, and the negative-sequence voltage magnitude at the right side of the section calculated from information from the second terminal is less than or equal to the negative-sequence voltage magnitude at the right side of the section calculated from the information from the first terminal.

32. The system of claim 17, wherein the fault calculation module comprises a fault location module that includes instructions for executing the steps of: determining the location of the fault using a numeric method to determine where the first profile is within a specified range of the second profile.

33. The system of claim 17, wherein the fault calculation module comprises a fault location module that includes instructions for executing the steps of: determining the location of the fault by calculating a ratio of the length to the fault along the faulted section to the length of the section.

34. The system of claim 33, wherein the ratio comprises m, and m is calculated using:

$$|\vec{V2}_{k\_L\_X} - m*\vec{Z2}_k*\vec{I2}_X| = |\vec{V2}_{k\_R\_Y} - (1-m)*\vec{Z2}_k*\vec{I2}_Y|$$

where:
- $\vec{V2}_{k\_L\_X}$ comprises a negative-sequence voltage at the left side of the k section calculated from the first terminal;
- $\vec{V2}_{k\_R\_Y}$ comprises a negative-sequence voltage at the right side of the k section calculated from the second terminal;
- $\vec{Z2}_k$ comprises a negative-sequence impedance of the k section;
- $\vec{I2}_Y$ comprises a negative-sequence current measured at the second terminal; and,
- $\vec{I2}_X$ comprises a negative-sequence current measured at the first terminal.

35. The system of claim 17, wherein the first profile comprises a plurality of negative-sequence voltage magnitudes and the second profile comprises plurality of negative-sequence voltage magnitudes, each calculated using:

$$V2_{D\_X} = |\vec{V2}_X - \Sigma_{i=1}^{k-1}\vec{Z2}_i*\vec{I2}_X - (m*\vec{Z2}_k*\vec{I2}_X)|$$

$$V2_{D\_Y} = |\vec{V2}_Y - \Sigma_{i=k+1}^{N}\vec{Z2}_i*\vec{I2}_Y - ((1-m)*\vec{Z2}_k*\vec{I2}_Y)|$$

$$m = d/L_k$$

$$d = D - \Sigma_{i=1}^{k-1}L_i$$

where:
- V2D_X comprises the negative-sequence voltage magnitude at point D calculated from measurements taken from the first terminal;
- V2D_Y comprises the negative-sequence voltage magnitude at point D calculated from measurements taken from the second terminal;
- $\vec{V2}_X$ comprises a negative-sequence voltage at the first terminal calculated from measurements taken from the first terminal;
- $\vec{V2}_Y$ comprises a negative-sequence voltage at the second terminal calculated from measurements taken from the second terminal;
- $\vec{I2}_X$ comprises a negative-sequence current calculated from measurements taken from the first terminal;
- $\vec{I2}_Y$ comprises a negative-sequence current calculated from measurements taken from the second terminal;
- D comprises the point along the length of the line where the symmetrical component power quantity is to be calculated;
- $\vec{Z2}_k$ comprises a negative-sequence impedance of section k;
- d comprises the length along the section k where the symmetrical component power quantity is to be calculated;
- N comprises the number of sections; and
- $L_k$ comprises the length of section k.

36. The system of claim 35, wherein each point D comprises a tower along the power line.

37. The system of claim 17, wherein the fault location comprises a section that includes the fault.

38. A method for determining a location of a fault on a non-homogeneous electric power line with a plurality of sections, the method comprising:
in a fault locator device configured to interface with an electric power distribution system, determining a faulted section by:
calculating a negative-sequence voltage magnitude at the left and right sides of each section from a first plurality of measurements from a first terminal of the electric power line, the first plurality of measurements representing electrical parameters received by the fault locator device;

calculating a negative-sequence voltage magnitude at the left and right side of each section from a second plurality of measurements from a second terminal of the electric power line, the second plurality of measurements representing electrical parameters received by the fault locator device; and the fault locator device determining the section in which,
- the negative-sequence voltage magnitude at the left side of the section calculated from measurements from the first terminal is less than or equal to the negative-sequence voltage magnitude at the left side of the section calculated from the measurements from the second terminal, and
- the negative-sequence voltage magnitude at the right side of the section calculated from measurements from the second terminal is less than or equal to the negative-sequence voltage magnitude at the right side of the section calculated from the measurements from the first terminal; and the fault locator device determining the location of the fault within the faulted section.

39. A method for determining a location of a fault on a non-homogeneous electric power line with a first terminal, a second terminal, and a plurality of sections therebetween using a fault locator device, the method comprising:

receiving electric power line information from the first terminal and electric power line information from the second terminal;

storing a representation of a physical property for each of the plurality of sections in a non-transitory computer-readable storage medium associated with the fault locator device, the physical property distinguishing at least one of the plurality of sections from at least one other section;

creating a first profile using the fault locator device based on measurements from the first terminal using the physical properties for each of the plurality of sections, the electric power line information from the first terminal, and the electric power line information from the second terminal;

creating a second profile using the fault locator device based on measurements from the second terminal using the physical properties for each of the plurality of sections, the electric power line information from the first terminal, and the electric power line information from the second terminal; and determining the location of the fault using the fault locator device and based on the first and second profiles.

\* \* \* \* \*